(12) United States Patent
Tabor et al.

(10) Patent No.: US 12,011,759 B1
(45) Date of Patent: Jun. 18, 2024

(54) ELECTROWETTING ASSISTED SELECTIVE PRINTING

(71) Applicant: Government of the United States, as represented by the Secretary of the Air Force, Wright-Patterson AFB, OH (US)

(72) Inventors: Christopher E Tabor, Kettering, OH (US); Alexander M Watson, Kettering, OH (US); Alexander B Cook, Beavercreek, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 659 days.

(21) Appl. No.: 16/250,693

(22) Filed: Jan. 17, 2019

Related U.S. Application Data

(60) Provisional application No. 62/618,239, filed on Jan. 17, 2018.

(51) Int. Cl.
*B22D 23/00* (2006.01)
*B22F 10/22* (2021.01)
(Continued)

(52) U.S. Cl.
CPC ............ *B22D 23/003* (2013.01); *B22F 10/22* (2021.01); *B33Y 10/00* (2014.12); *B33Y 30/00* (2014.12);
(Continued)

(58) Field of Classification Search
CPC ....................................................... B22F 10/22
See application file for complete search history.

(56) References Cited

U.S. PATENT DOCUMENTS 7,708,384 B2   5/2010   Sugahara
8,089,013 B2   1/2012   Steckl et al.
(Continued)

FOREIGN PATENT DOCUMENTS

CN       104907238 A1    9/2015
KR       20110019141 A1  2/2011

OTHER PUBLICATIONS

Han, Yiwei, and Jingyan Dong. "High-resolution electrohydrodynamic (EHD) direct printing of molten metal." Procedia Manufacturing 10 (2017): 845-850. (Year: 2017).*
(Continued)

*Primary Examiner* — Jophy S. Koshy
*Assistant Examiner* — Joshua S Carpenter
(74) *Attorney, Agent, or Firm* — AFMCLO/JAZ; Larry L. Huston

(57) ABSTRACT

An extrusion printing process for conductive materials and a conductive material extrusion system. The process includes attaching a counter-electrode to a first side of a substrate. A drive voltage is applied to the counter-electrode and to a conductive material to be extruded onto a second side of the substrate, opposite the first side. The conductive material is extruded onto the second side of the substrate while the drive voltage is being applied to the counter-electrode and conductive material. The conductive material is selected from a metal having a melting point ranging from about −20° C. to about 150° C.

14 Claims, 3 Drawing Sheets

(51) Int. Cl.
   *B33Y 10/00* (2015.01)
   *B33Y 30/00* (2015.01)
   *B33Y 70/00* (2020.01)
   *H05K 3/12* (2006.01)

(52) U.S. Cl.
   CPC ............ *B33Y 70/00* (2014.12); *H05K 3/1275* (2013.01); *H05K 2203/0126* (2013.01)

(56) References Cited

U.S. PATENT DOCUMENTS

| | | |
|---|---|---|
| 2012/0006681 A1 | 1/2012 | Kaler et al. |
| 2015/0197062 A1* | 7/2015 | Shinar .................. B29C 64/112 |
| | | 700/98 |
| 2015/0251214 A1* | 9/2015 | Leschkies ................ D01F 6/50 |
| | | 427/469 |
| 2015/0290938 A1* | 10/2015 | Rogers ...................... B41J 2/06 |
| | | 347/55 |
| 2016/0029475 A1* | 1/2016 | Hwang .................. H05K 1/097 |
| | | 427/532 |
| 2018/0168029 A1* | 6/2018 | Kuk ..................... H05K 9/0026 |

OTHER PUBLICATIONS

Boley, W. J.; White, E. L.; Chiu, G. T.-C.; Kramer, R. K., "Direct Writing of Gallium-Indium Alloy for Stretchable Electronics," Advanced Functional Materials, Wiley-VCH Verlag GmbH & Co. Weinheim, 2014, pp. 1-7.

Onses, S.M.; Sutanto, E.; Ferreira, P. M.; Alleyne, A. G.; and Rogers, J. A., "Mechanisms, Capabilities and Applicaitons of High-Resolution Electrohydrodynamic Jet Printing," Wiley-VCH Verlag GmbH & Co. Weinheim, No. 34, Sep. 9, 2015, pp. 4237-4266.

Tabatabai, A.; Fassler, A.; Usiak, C.; Majidi, C., "Liquid-Phase Gallium-Indium Alloy Electronics with Microcontact Printing," American Chemical Society, Washington, D.C. Apr. 30, 2013, pp. 1-21.

\* cited by examiner

ELECTROWETTING ASSISTED SELECTIVE PRINTING

CROSS-REFERENCE TO RELATED APPLICATION

This application claims the benefit of and priority to U.S. Provisional Application Ser. No. 62/618,239, filed 17 Jan. 2018, which is hereby incorporated herein by reference.

RIGHTS OF THE GOVERNMENT

The invention described herein may be manufactured and used by or for the Government of the United States for all governmental purposes without the payment of any royalty.

TECHNICAL FIELD

The disclosure is directed to a method for printing of liquid metals and in particular to extrusion printing of liquid metals on non-conductive materials or materials having poor surface/conductor interface behavior.

BACKGROUND OF THE INVENTION

Additive manufacturing of electronics has historically been explored as a means to add functionality on demand both on the surface of a premade structure or embedded within a structure during the part manufacturing process. The electrical material being additively printed must exist in a printable state, usually in a colloidal ink of solid conductive particles suspended in an appropriate solvent which is printed using one of several techniques such as ink jet printing (IJP), electrohydrodynamic printing (E-Jet), or aerosol jet printing (AJP). These techniques deposit droplets of the colloidal ink suspension that must be post processed after printing to coalesce the individual particles and render them electrically contiguous.

A complimentary approach to printing conductive materials is extrusion-based printing which pushes a liquefied material through a nozzle tip and relies on solidification of the print material or some other mechanism to hold the printed material in place. Extrusion-based printing is usually reserved for non-conductive materials such as thermoplastics, but has been demonstrated using near-room temperature liquid metals. Extrusion-based printing conductive liquids has the advantage of printing a fully conductive element without the need of post processing to coalesce individual particles. However, this process is driven by the extruded material's surface adhesion to the substrate, resulting in only a few substrates being amenable to being printed onto by room temperature liquid metals. On many substrates the extrusion-based printing method yields limited control of the trace geometry and on others printing liquid metals is nearly impossible.

SUMMARY OF THE INVENTION

Accordingly, there exists an ongoing need for a printing process that can be used to print conductive materials on a variety of substrates without the need for post processing of the conductive materials. In view of the foregoing, an embodiment of the disclosure provides an extrusion printing process for conductive materials and a conductive material extrusion system. The process includes attaching a counter-electrode to a first side of a substrate. A drive voltage is applied to the counter-electrode and to a conductive material to be extruded onto a second side of the substrate, opposite the first side. The conductive material is extruded onto the second side of the substrate while the drive voltage, either AC or DC, is being applied between the counter-electrode and the conductive material. The conductive material has a melting point ranging from about −20° C. to about 150° C.

Other embodiments of the disclosure provide use of a conductive material to be extruded having a melting point ranging from about 25° C. to about 45° C. In another embodiment the conductive material is selected from gallium, alloys of gallium, and alloys of bismuth.

In some embodiments the drive voltage is varied to vary a width of extruded conductive material deposited onto the substrate. In other embodiments, the drive voltage is varied to vary a thickness of the extruded conductive material deposited onto the substrate. In still other embodiments the drive voltage ranges from about 1 volt to about 10,000 volts.

In some embodiments, the substrate is a dielectric substrate. In other embodiments, the substrate is a conductive substrate. In still other embodiments, the substrate is selected from the group of glass reinforced polytetrafluoroethylene laminate boards, glass reinforced ceramic and polytetrafluoroethylene laminate boards, glass reinforced epoxy laminate boards, polytetrafluoroethylene materials and coatings, biaxially oriented polypropylene (BOPP), biaxially oriented polyethylene terephthalate (BOPET), hydrophobic surfaces, super-hydrophobic surfaces, high particle count surfaces, rough surfaces, and hydrated surfaces.

In some embodiments, the substrate has a thickness ranging from about 2 nanometers to about 0.75 millimeters.

A primary advantage of the disclosed embodiments is an ability to print a conductive circuit on a variety of non-conductive and conductive substrates without the need for a post treating or curing process for the conductive material. Other advantages of the process and system according to the disclosed embodiments include, but are not limited to: (1) an ability to print onto a media that does not favor printing, such as viscous media-like pre-polymers; (2) enhanced reliability and repeatability of printing on suitable substrates; (3) improved print pattern fidelity, i.e., more precise corners and structures of the printed conductive materials; (4) sacrificial material printing to create channel structures where the liquid conductor can be extracted therefrom after a matrix around the channel is formed; (5) ability to reduce the size of the printed features by patterning the underlying electrode and applying a voltage in only certain patterns; (6) an ability to print on horizontal and vertical surfaces using the same equipment set-up; (7) an ability to pattern transfer an underlying electrode to conductive liquid traces on thin substrates or films; (8) in-situ trace optimization via capacitive feedback during the conductive material extrusion process; (9) automated selective conductor printing by electronic control; (10) providing a method of liquid containment while printing low viscosity conductive liquids; (11) providing enhanced out-of-plane printing; and (12) providing a technique compatible with roll-to-roll manufacturing for high throughput of flexible and stretchable electronics, as demonstrated by the dip coat or submersion method.

BRIEF DESCRIPTION OF THE DRAWINGS

Other features and advantages of the disclosed embodiments may be evident by reference to the following detailed description, drawings and claims wherein:

DETAILED DESCRIPTION OF EXEMPLARY EMBODIMENTS

As described in more detail below, the disclosed embodiments may be used to place conductive fluids onto a non-conductive surface and control their position and feature sizes through an applied voltage, regardless of the substrate and substrate/fluid interface properties. The methods and systems described herein may be further used to print highly accurate liquid metal lines or traces onto fluorinated or other radio frequency (RF)/electrically insulating materials in order to build a reconfigurable and/or stretchable electronic component.

As used herein, the term "printing" is used in the broadest sense and means depositing a first material onto a surface of a second material.

As used herein, the term "extruding" or "extrusion" means the flowing of a material onto a surface from a molten source of the material wherein the material contains little or no solvent or carrier fluid.

As used herein, the term "electrowetting" means changing the adhesion characteristics of a substrate on which a conductive material is to be printed by applying a voltage to the conductive material and a counter-electrode attached to the substrate.

The disclosure enables extrusion-based printing of conductive fluids onto a front side of any conductive, non-conductive, or dielectric substrate by means of an applied voltage between a conductive fluid to be extruded and a counter-electrode located on the back side of the substrate. The voltage applied to the counter-electrode and the conductive fluid may be controlled in order to vary the print/no print results as well as dimensions of the printed traces. In other words, the applied voltage may be used to control the extrusion process with enough precision to reliably alter the dimensions (e.g., cross-sectional width and height) of the printed traces, or switch the material extrusion on and off at will.

Electrowetting describes the phenomenon in which an applied voltage between a conductive fluid and a dielectric-coated, conductive substrate creates an electrostatic enhancement to the liquid-substrate wettability. Notably, this process enables printing by increasing adhesion or wetting of the surface, not by directly triggering or modulating extrusion from the nozzle as in e-jet printing methods. Applying this principle to extruded fluid conductors enables printing onto unfavorable surfaces on which the surface energy mismatch between conductive fluid and substrate would otherwise preclude printing.

Figure 1A:
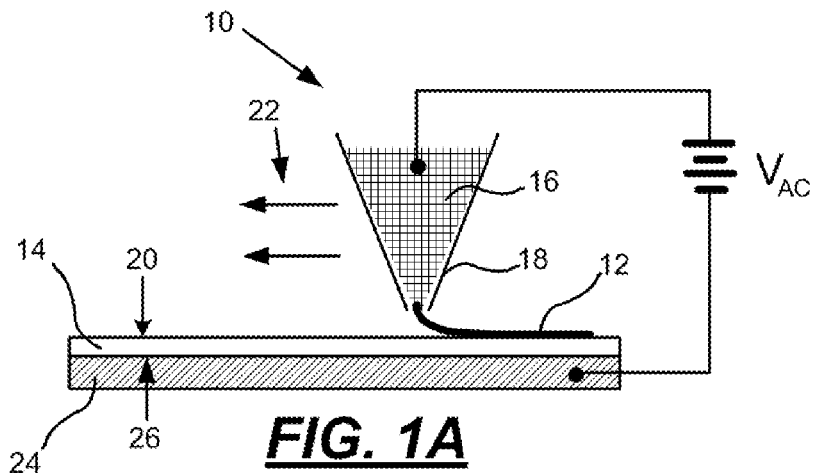
FIG. 1A is a schematic view of an extrusion process for printing a conductive material on a substrate while applying a voltage to a counter-electrode attached to the substrate.
Figure 1B:
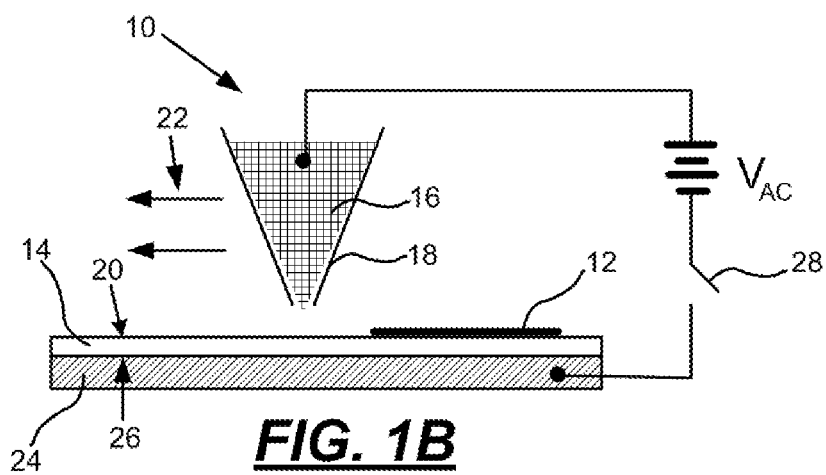
FIG. 1B is a schematic view of a continuation of the extrusion process of FIG. 1A wherein the printing of a conductive material on the substrate is terminated by terminating the voltage applied to the counter-electrode attached to the substrate.
Figure 1C:
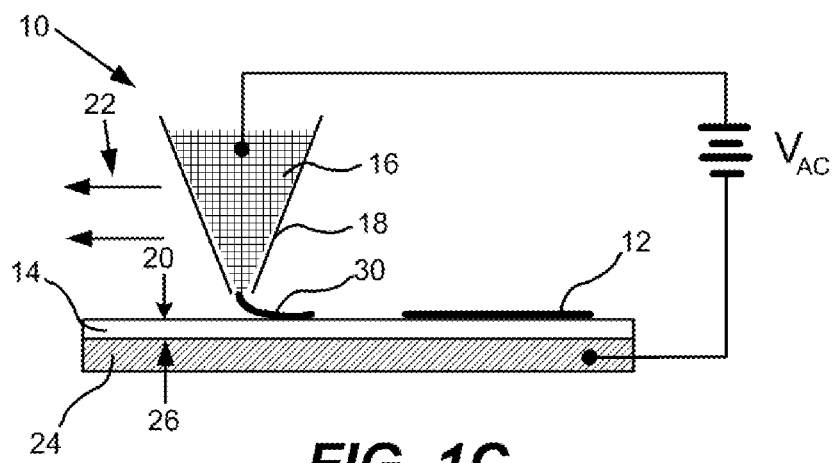
FIG. 1C is a schematic view of a continuation of the extrusion process of FIG. 1A wherein the printing of conductive material on the substrate is resumed by again applying a voltage to the counter-electrode attached to the substrate.
Figure 2A:
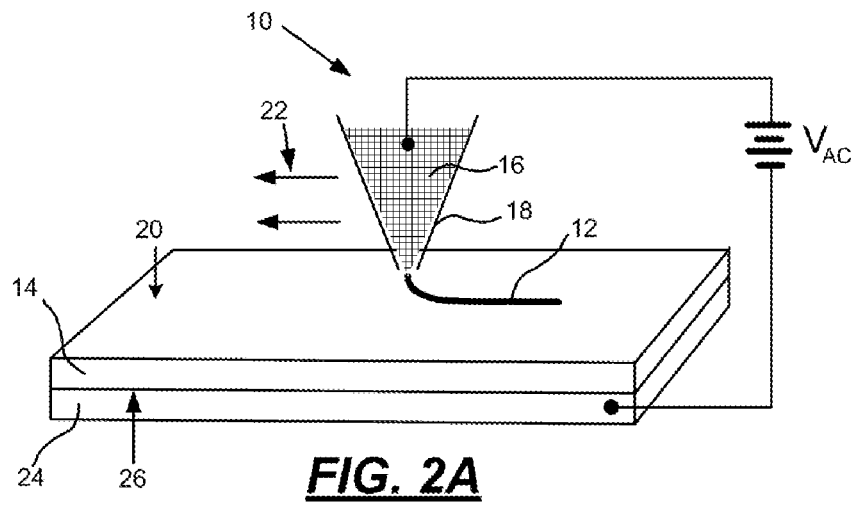
FIG. 2A is a perspective schematic view of an extrusion process for printing a conductive material on a substrate by applying a first voltage to the counter-electrode attached to the substrate.

With reference to FIGS. 1A-1C and 2A-2C, a method for extrusion printing 10 of a conductive trace 12 on a non-conductive substrate 14 is illustrated. According to the method, a conductive material 16 having a melting point ranging from about 25° C. to about 45° C. is deposited from an extruder 18 onto a surface 20 of the substrate 14 as the extruder is moved in the direction of arrows 22 across the substrate 14 (FIGS. 1A and 2A). A counter-electrode 24 is attached to an opposing surface 26 of the substrate 14. When a drive voltage $V_{AC}$ is applied to the conductive material 16 and the counter-electrode 24, the conductive trace 12 is deposited on the substrate 14.

In FIG. 1B, the drive voltage $V_{AC}$ is terminated between the counter-electrode 24 and the conductive material 16 by switch 28 resulting in a termination of the deposition of the conductive material 16 onto the substrate 20.

In FIG. 1C, a resumption of the drive voltage $V_{AC}$ results in continuing the deposition of conductive trace 30 on the substrate 14.

Figure 2B:
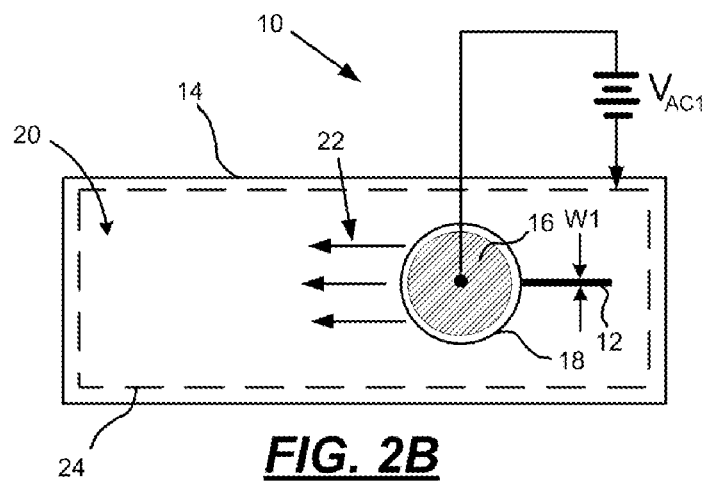
FIG. 2B is a plan view of the extrusion of conductive material on the substrate while applying the first voltage to the counter-electrode attached to the substrate.
Figure 2C:
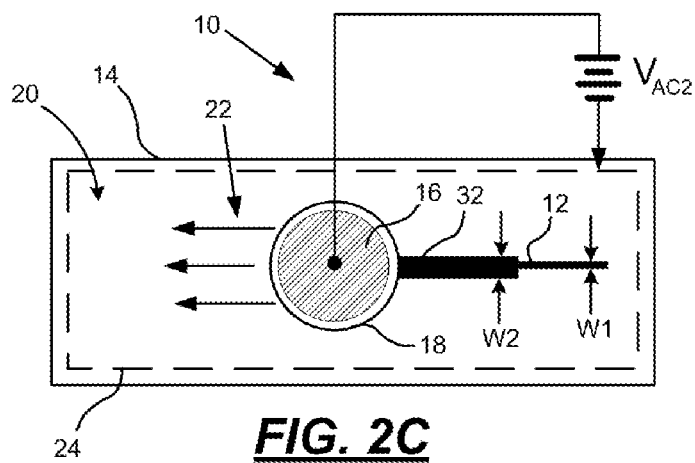
FIG. 2C is a plan view of the extrusion of conductive material on the substrate while applying a second voltage to the counter-electrode attached to the substrate.

According to FIGS. 1A-1C, printing may be turned on or off by turning the voltage on or off. FIGS. 2B-2C illustrate in plan view, the control of a width and/or thickness of conductive trace 12 and 32 applied to the substrate 14. In FIGS. 2B and 2C, the counterelectrode is shown in outline form and is attached to the opposing surface 26 (FIG. 2A) of the substrate 14. As shown in FIG. 2B, when a voltage VAC1 is applied between the conductive material 16 and the counter-electrode 24, the conductive trace 12 has a width W1. However, if the voltage applied to the counter-electrode 24 and conductive material 16 is increased to VAC2, wherein VAC2>VAC1, a wider and/or thicker conductive trace 32 having width W2 may be produced. The higher voltage results in a stronger electrowetting effect between the conductive material 16 and the counter electrode 24 enabling tuning of the width or thickness of the conductive trace as the conductive material 16 is extruded onto the substrate 14. The foregoing approach may also be used in a feedback loop to read out changes in capacitance between the printed conductive material 16 and the counter electrode 24 as the surface area coated with conductive material increases during printing. Increased surface coverage by the conductive trace provides higher capacitance. A sudden decrease in capacitance could indicate a disconnected trace.

In FIGS. 1A-1C and 2A-2C, the size of the counter electrode 24 is similar to the size of the substrate 14. However, by patterning the counter-electrode 24 attached to opposing side 26 of the substrate 14, further control over the printed features of the conductive trace may be obtained. Accordingly, by using patterned counter-electrodes 24, the smallest features that may be printed may be an order of magnitude less than without any applied voltage to the substrate 14. Also, a patterned counter-electrode 24 may provide additional means to pattern conductive traces on substrates.

Extrusion-based printing has been demonstrated for near-room temperature gallium-based liquid metals and metal alloys. In the case of these gallium liquid metal materials, traces are held in place by their oxide layer and extrusion is driven by the adhesion between the oxide and the substrate. Other materials that may be used according to the disclosed embodiments, include but are not limited to, alloys of bismuth.

A first electrode may be associated with the conductive material either by inserting an electrode in the bulk material or by using a conductive extrusion head having an electrode connected to the extrusion head. The drive voltage during the extrusion process may range from about 1 volt to about 10,000 volts. The upper drive voltage is only limited by the breakdown voltage of the substrate material. Thicker substrates may require higher drive voltages. Accordingly, suitable voltages may range from about 20 to 1000 volts, or from about 50 to about 500 volts.

The advantage of printing conductive fluids is that it yields a fully conductive element without the need of any post processing step. An extrusion-based printing process is subject to the adhesion between conductive fluid and the printing surface, thus, a limited selection of substrates are amenable to conventional extrusion-based printing processes. Also, on many substrates, using a conventional extrusion-based printing process yields limited control of the trace geometry. Printing conductive fluids via these processes on non-conductive substrates can be difficult, and not possible in many circumstances. Surprisingly, the foregoing embodiments significantly improve the ability to print conductive traces on conductive, non-conductive and/or dielectric substrates, while providing a method to control width and/or thickness of the conductive traces.

Accordingly, the disclosed embodiments provide a method to control the extrusion of conductive materials onto a wide variety of substrates by applying a voltage between the conductive material and a counter electrode attached to an opposing side of the substrate. Commercial applications of the foregoing extrusion-based printing process include, but are not limited to, printing on glass reinforced polytetrafluoroethylene laminate boards, glass reinforced ceramic and polytetrafluoroethylene laminate boards, glass reinforced epoxy laminate boards, polytetrafluoroethylene materials and coatings, hydrophobic surfaces, super-hydrophobic surfaces, high particle count surfaces, rough surfaces, and hydrated surfaces. The thickness of the substrate may vary widely and may range from about 2 nanometers to about 0.75 millimeters or more. Other thicknesses may range from about 1 micron to about 200 microns.

Also, since the conductive traces are printed directly from a molten conductive material, post processing to remove solvents and/or cure the printed traces on the substrate is not necessary. Since the applied voltage causes the conductive material to adhere to the substrate, printing of the substrate can be done in any orientation, including on horizontal, vertical and inverted horizontal surfaces.

Figure 3A:
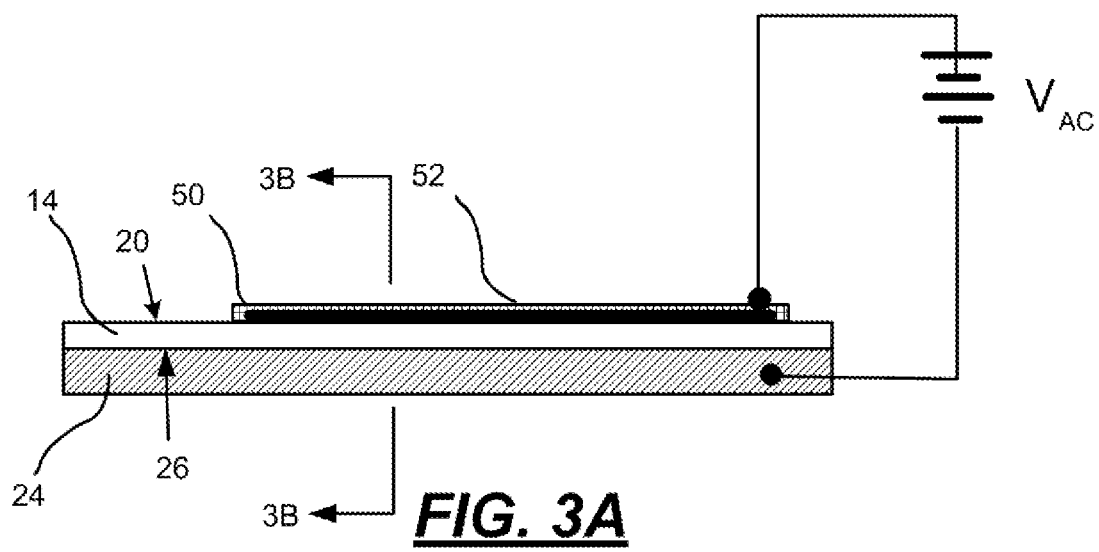
FIG. 3A is a side view, not to scale, of a conductive material on a substrate that is encapsulated by a channel-forming material.
Figure 3B:
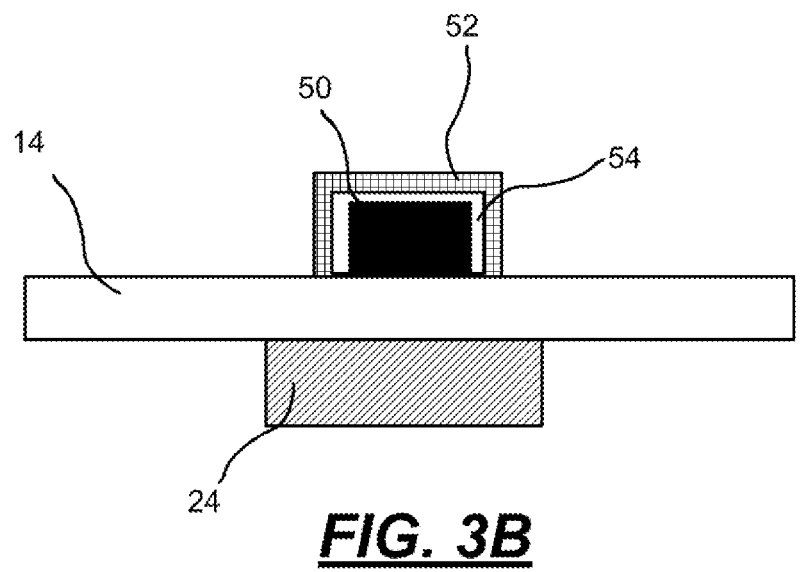
FIG. 3B is a cross-sectional view, not to scale, of the channel-forming material encapsulating the conductive material of FIG. 3A.
Figure 3C:
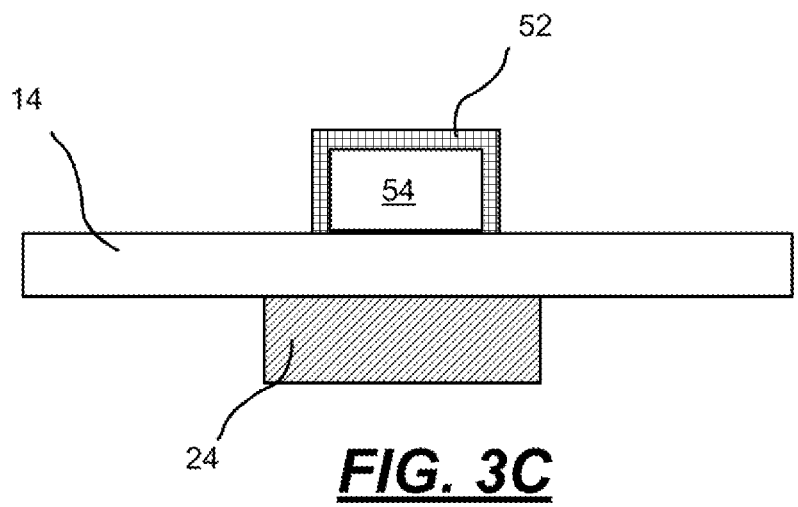
FIG. 3C is a cross-sectional view, not to scale, of a channel structure provided by the channel-forming material once the conductive material is extracted from the channel-forming material.

The foregoing extrusion-based printing processes described in FIGS. 1A-1C and FIGS. 2A-2C may be adapted to form channel structures on a substrate. With reference to FIGS. 3A-3C, there is illustrated a channel forming process using the conductive material applied to a substrate by the extrusion-based printing process. As described above, the counter-electrode 24 is applied to the first side 26 of the substrate 14, and the drive voltage $V_{AC}$ is applied to the counter-electrode 24 and to the conductive material to be extruded onto the second side 20 of the substrate.

After the conductive material has been extruded onto the substrate to provide a sacrificial channel 50 on the substrate 14, a moldable, non-conductive material 52 is applied to the sacrificial channel 50 to encapsulate the sacrificial channel 50 as shown in FIGS. 3A and 3B. The moldable, non-conductive material 52 may be any suitable polymeric material that may be hardened by radiation, heat, evaporation, or chemical reaction.

After the moldable, non-conductive material 52 has hardened to form the channel 54, the conductive material is extracted from the channel structure 54 as shown in FIG. 3C. Extracting the conductive material from the channel structure 54 may be effected by removing the drive voltage $V_{AC}$ from the counter-electrode and conductive material and blowing the conductive material through and out of the channel structure 54. The channel structure 54 remains on the substrate 14 once the conductive material is removed from the channel structure 54 and has the shape of the sacrificial channel 50 that was extruded onto the substrate 14.

According to one embodiment of the invention, a dip coat or submersion type printing process is used. This embodiment allows rapid and efficient reproduction of a conductive circuit by forcing bulk conductive liquid metal to adhere only to desired portions of a template. In this method, one electrode is placed on the conductive circuit pattern of a substrate and the counter-electrode is electrically connected to a pool or bath of conductive liquid metal. The conductive circuit pattern is coated in a dielectric film and then dipped into the liquid metal bath. In one embodiment, the dielectric film is flexible. The voltage is applied and the substrate is extracted from the liquid metal bath through a narrow aperture or slit, replicating the substrate's conductive pattern onto the thin film dielectric by the localized electrowetting effect between the underlying pattern and reservoir of liquid metal.

To achieve small dimensions, the height of the allowable printed traces is confined during the extraction process, as the substrate is pulled through a slit of a height slightly larger than the substrate thickness. This confinement prevents excess liquid metal from being deposited on the substrate. This process allows for the high fidelity of pattern transfer powered by the local electrowetting effect directly from fine features of the conductive substrate pattern to a liquid metal pattern on the surface of the thin film. Selecting a slit dimension that is approximately equal to the smallest desired circuit feature side has been shown to produce acceptable results. By way of example and not limitation, a slit height of approximately 20 microns will be effective for circuits having a critical dimension of approximately 20 microns.

Dip coat printing on 250 micron parallel lines with 250 micron spaces between are achievable. However, the process is compatible with much larger and potentially smaller dimensions, depending on the level of confinement during extraction. Features as small as 20 microns and as large as 3 millimeters could reasonably be expected to be achieved with this method, before surface tension and gravity (respectively) start dominating the electrowetting forces.

This dip coat or submersion method enables a high throughput, parallel printing process to rapidly replicate patterned liquid metal circuits.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. A method for extrusion printing conductive materials, comprising:
   attaching a counter-electrode to a first surface of a substrate having a substrate perimeter defining a substrate shape, the counter-electrode having a counter-electrode perimeter defining a counter-electrode shape, the counter electrode perimeter being within and smaller than the substrate perimeter;
   applying a drive voltage to the counter-electrode and a conductive material, the conductive material having a melting point ranging from about −20° C. to about 150° C., to be extruded on a second surface of the substrate, opposite said first surface of the substrate; and
   extruding the conductive material onto said second surface of the substrate while the drive voltage is being applied to the counter-electrode and the conductive material; the drive voltage being $V_{AC1}$ and the conductive material having a nonzero width WL and increasing the drive voltage to $V_{AC2}$ during extrusion to controllingly produce a conductive material having a width $W_2$, the width $W_2$ being wider than the width $W_1$ and the drive voltage $V_{AC2}$ being greater than the drive voltage $V_{AC1}$.

2. The method of claim 1, wherein the width $W_1$ of the conductive material and the width $W_2$ of the conductive material are contiguous.

3. The method of claim 1, wherein the drive voltage ranges from about 20 volts to about 1000 volts to yield the width $W_1$ of the conductive material and the width $W_2$ of the conductive material without a space therebetween.

4. The method of claim 1, wherein the substrate is a dielectric substrate.

5. The method of claim 1, wherein the substrate has a thickness ranging from about 2 nanometers to about 0.75 millimeters.

6. The method of claim 1, further comprising varying the drive voltage during extrusion to vary a width of a continuous extruded conductive material deposited on the substrate between width $W_1$ and width $W_2$ with a step change therebetween, the substrate perimeter having a rectangular shape, the counter-electrode perimeter having a rectangular shape and being within, smaller than and concentric with the substrate perimeter.

7. The method of claim 1, further comprising varying the drive voltage to vary a thickness of the extruded conductive material deposited on the substrate, the substrate perimeter having a rectangular shape, the counter-electrode perimeter having a rectangular shape and being within the substrate perimeter.

8. The method of claim 1, wherein the drive voltage is a DC voltage.

9. A method of forming a channel structure in a moldable, non-conductive material, the method comprising the steps of:
   attaching a counter-electrode to a first surface of a substrate having a substrate perimeter defining a substrate shape, the counter-electrode having a counter-electrode perimeter defining a counter-electrode shape, the counter electrode perimeter being within and smaller than the substrate perimeter;
   applying a drive voltage to the counter-electrode and a conductive material, the conductive material having a melting point ranging from about −20° C. to about 150° C., to be extruded onto a second surface of the substrate, opposite said first surface of the substrate;
   extruding the conductive material onto said second surface of the substrate while the drive voltage is being applied to the counter-electrode and the conductive material providing a sacrificial channel on the substrate;
   the drive voltage being $V_{AC1}$, and the conductive material having a constant width $W_1$ and increasing the drive voltage to $V_{AC2}$ during extrusion to controllingly produce a conductive material having a constant width $W_2$ without a space between the width $W_1$ and $W_2$, the width $W_2$ being wider than the width $W_1$ and the drive voltage $V_{AC2}$ being greater than the drive voltage $V_{AC1}$;
   applying the moldable, non-conductive material to said second surface of the substrate to encapsulate said sacrificial channel on the substrate;
   removing the drive voltages from the counter-electrode after the moldable, non-conductive material has hardened to form said sacrificial channel on the substrate; and
   extracting the conductive material from said sacrificial channel on the substrate to open the channel structure.

10. The method of claim 9, wherein the conductive material having the width $W_1$ and the conductive material having the width $W_2$ are contiguous.

11. The method of claim 9, wherein the drive voltage ranges from about 1 volt to about 10,000 volts to yield the width $W_1$ of the conductive material and the width $W_2$ of the conductive material without a space therebetween.

12. The method of claim 9, further comprising varying the drive voltage to stepwise vary a width of the extruded conductive material deposited on the substrate, the substrate perimeter having a rectangular shape, the counter-electrode perimeter having a rectangular shape and being within the substrate perimeter.

13. The method of claim 9, further comprising varying the drive voltage to vary a thickness of the extruded conductive material deposited on the substrate, the substrate perimeter having a rectangular shape, the counter-electrode perimeter having a rectangular shape and being within, smaller than and concentric with the substrate perimeter.

14. A method for extrusion printing conductive materials, comprising:
   attaching a counter-electrode to a first surface of a substrate having a substrate perimeter defining a substrate shape, the counter-electrode having a counter-electrode perimeter defining a counter-electrode shape, the counter electrode perimeter being within and smaller than the substrate perimeter;
   applying a drive voltage to the counter-electrode and directly to a conductive material contained within an extruder for deposit therefrom onto a second surface of the substrate, the drive voltage being $V_{AC1}$ and the conductive material having a nonzero width WL increasing the drive voltage during extrusion to $V_{AC2}$ to yield a conductive material having a constant width $W_2$ without a space between the width $W_1$ and $W_2$, the width $W_2$ being wider than the width $W_1$ and the drive voltage $V_{AC2}$ being greater than the drive voltage $V_{AC1}$ the conductive material having a melting point ranging from about −20° C. to about 150° C., to be extruded on said second surface of the substrate, opposite said first surface of the substrate; and extruding the conductive material onto said second surface of the substrate while the drive voltage is being applied to the counter-electrode and directly to the conductive material contained within said extruder.

* * * * *